(12) United States Patent
Chen et al.

(10) Patent No.: US 11,688,693 B2
(45) Date of Patent: Jun. 27, 2023

(54) SEMICONDUCTOR PACKAGES AND METHOD OF MANUFACTURE

(71) Applicant: Taiwan Semiconductor Manufacturing Company, Ltd., Hsinchu (TW)

(72) Inventors: Wei-Yu Chen, Hsinchu (TW); Chun-Chih Chuang, Taichung (TW); Kuan-Lin Ho, Hsinchu (TW); Yu-Min Liang, Zhongli (TW); Jiun Yi Wu, Zhongli (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/883,186

(22) Filed: May 26, 2020

(65) Prior Publication Data

US 2021/0125933 A1 Apr. 29, 2021

Related U.S. Application Data

(60) Provisional application No. 62/927,344, filed on Oct. 29, 2019.

(51) Int. Cl.
*H01L 23/538* (2006.01)
*H01L 23/00* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 23/3128; H01L 23/5383; H01L 23/5386; H01L 23/49811; H01L 23/5384; H01L 23/5385; H01L 23/49816; H01L 23/49838; H01L 23/142; H01L 23/481; H01L 23/49827;
(Continued)

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

TW 201731054 A 9/2017
TW 201814843 A 4/2018
(Continued)

*Primary Examiner* — Kyoung Lee
*Assistant Examiner* — Christina A Sylvia
(74) *Attorney, Agent, or Firm* — Slater Matsil, LLP

(57) ABSTRACT

A package includes an interposer structure free of any active devices. The interposer structure includes an interconnect device; a dielectric film surrounding the interconnect device; and first metallization pattern bonded to the interconnect device. The package further includes a first device die bonded to an opposing side of the first metallization pattern as the interconnect device and a second device die bonded to a same side of the first metallization pattern as the first device die. The interconnect device electrically connects the first device die to the second device die.

18 Claims, 18 Drawing Sheets

(51) Int. Cl.
*H01L 21/48* (2006.01)
*H01L 21/56* (2006.01)
*H01L 21/683* (2006.01)
*H01L 23/31* (2006.01)

(52) U.S. Cl.
CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 2221/68372* (2013.01); *H01L 2224/214* (2013.01); *H01L 2924/1431* (2013.01); *H01L 2924/1434* (2013.01); *H01L 2924/19106* (2013.01)

(58) Field of Classification Search
CPC . H01L 23/525; H01L 23/528; H01L 21/4853; H01L 21/4857; H01L 21/565; H01L 21/568; H01L 21/6835; H01L 24/19; H01L 24/20; H01L 2221/68372; H01L 2221/68345; H01L 2221/68359; H01L 2224/214; H01L 2924/1431; H01L 2924/1434; H01L 2924/19106; H01L 2225/06517; H01L 2225/06513; H01L 25/0652; H01L 25/16; H01L 25/50; H01L 25/0655; H01L 25/0657
See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,163,802 B2 | 12/2018 | Lin et al. | |
| 10,797,038 B2 | 10/2020 | Yu et al. | |
| 10,833,052 B2 | 11/2020 | Shih | |
| 2009/0282674 A1 | 11/2009 | Chen et al. | |
| 2013/0127042 A1* | 5/2013 | Lee | H01L 23/3128 257/737 |
| 2014/0138816 A1 | 5/2014 | Lu et al. | |
| 2014/0185264 A1* | 7/2014 | Chen | H01L 25/0652 361/814 |
| 2015/0069623 A1* | 3/2015 | Tsai | H01L 23/31 257/774 |
| 2016/0064254 A1* | 3/2016 | Hu | H05K 3/00 174/258 |
| 2016/0064309 A1* | 3/2016 | Su | H01L 23/5389 257/773 |
| 2016/0172292 A1* | 6/2016 | Hsu | H01L 23/49833 257/698 |
| 2016/0260684 A1* | 9/2016 | Zhai | H01L 21/568 |
| 2017/0062383 A1 | 3/2017 | Yee et al. | |
| 2017/0077022 A1* | 3/2017 | Scanlan | H01L 22/14 |
| 2018/0102313 A1* | 4/2018 | Shih | H01L 21/6835 |
| 2019/0238134 A1* | 8/2019 | Lee | H03K 19/1737 |
| 2019/0295952 A1* | 9/2019 | Sikka | H01L 23/5381 |

FOREIGN PATENT DOCUMENTS

| | | |
|---|---|---|
| TW | 201820571 A | 6/2018 |
| WO | 2018182597 A1 | 10/2018 |
| WO | 2019132965 A1 | 7/2019 |

* cited by examiner

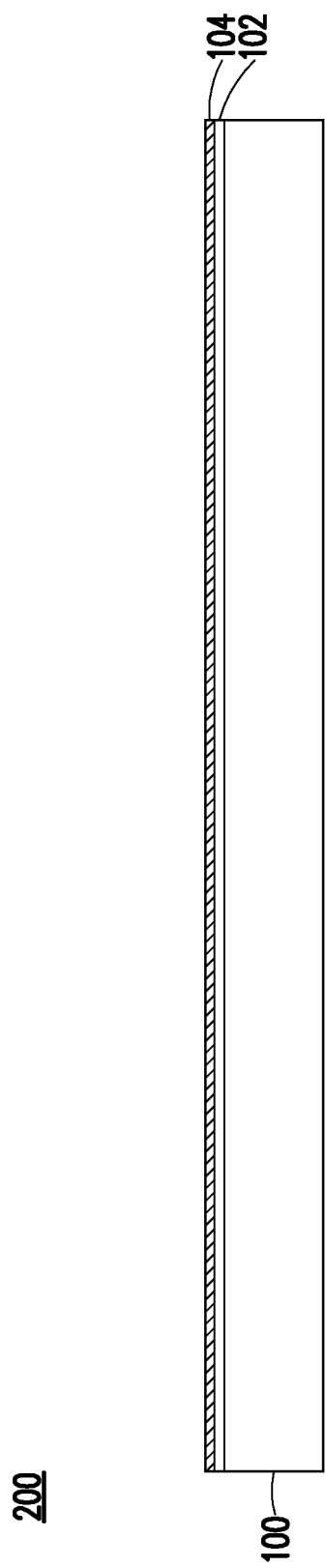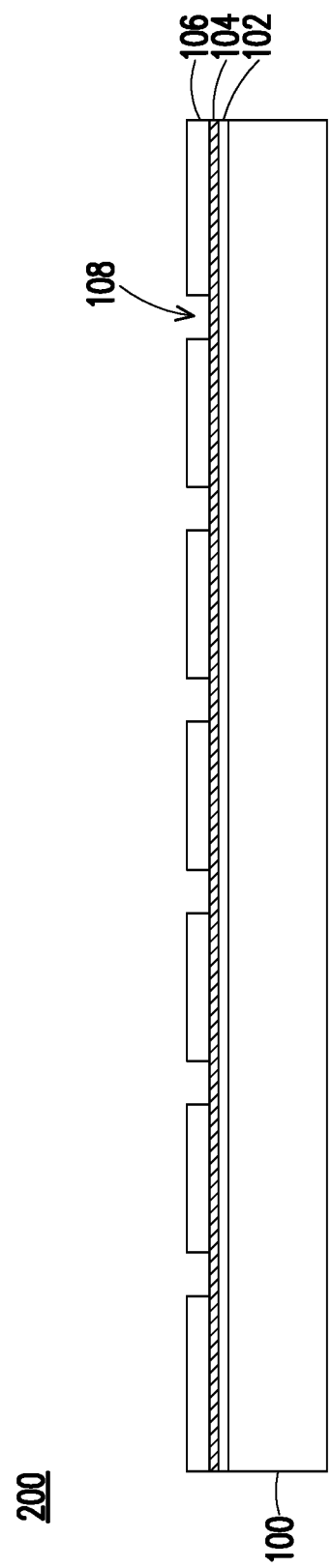

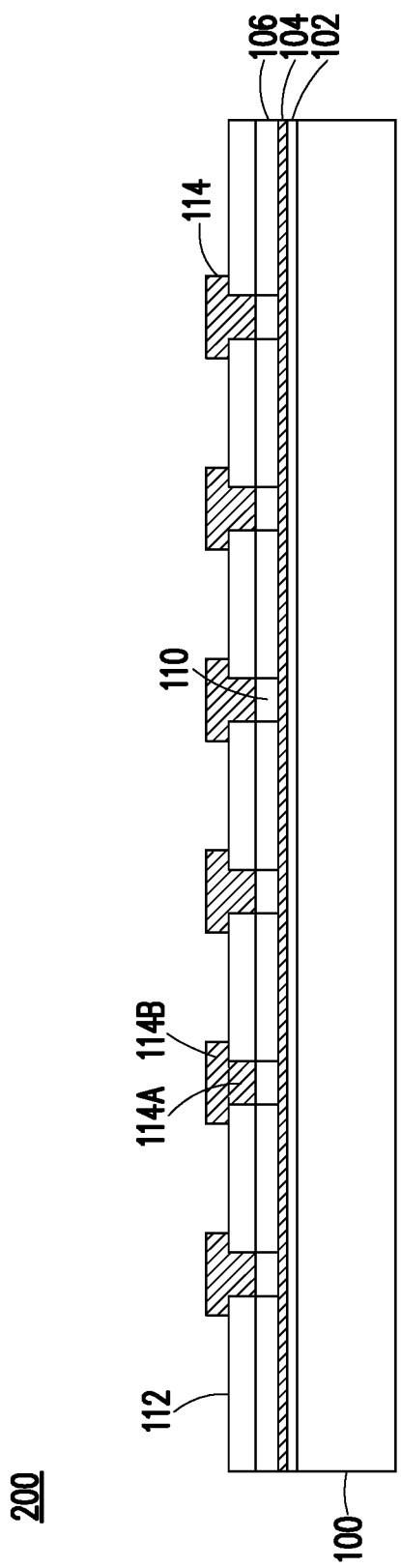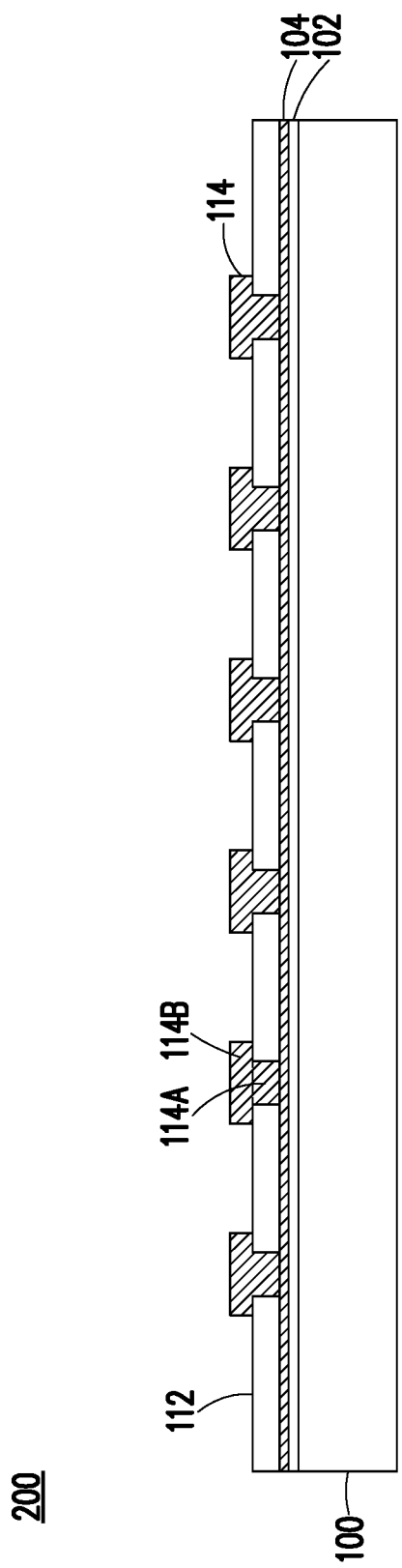

SEMICONDUCTOR PACKAGES AND METHOD OF MANUFACTURE

PRIORITY CLAIM AND CROSS-REFERENCE

This application claims the benefits of U.S. Provisional Application Ser. No. 62/927,344, filed on Oct. 29, 2019, which application is hereby incorporated herein by reference in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5A, 5B, 6, 7, 8, 9, 10, and 11 illustrate a cross-sectional views of intermediate steps of manufacturing of an interposer structure incorporating the interconnect device in accordance with some embodiments.

DETAILED DESCRIPTION

Figure 1:
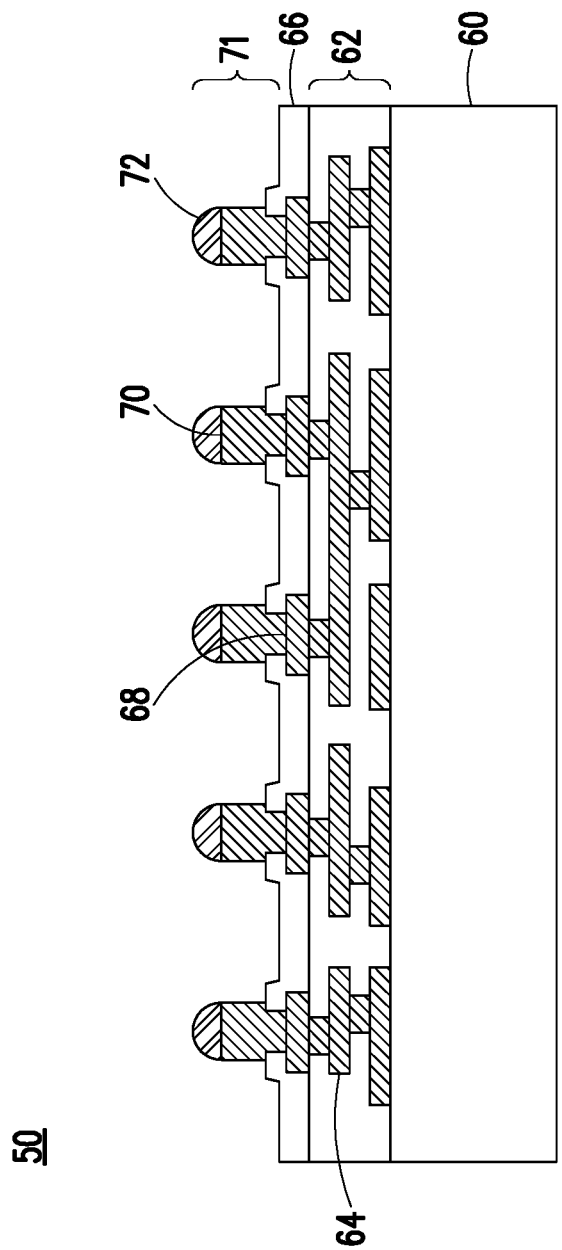
FIG. 1 illustrates a cross-sectional view of an interconnect device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package and the formation thereof are described. Various embodiments may use heterogeneous integration to provide a package with device dies, interconnect devices, and passive devices. Three-dimensional (3D) packages include an interposer structure, which has an internal interconnect device. The interconnect device provides electrical interconnections between device dies (e.g., system on chip (SoC), other functional dies, hybrid memory cubes (HBM), other memory dies, multifunctional dies, or the like) directly bonded to the interposer structure. The interposer structure may further include a passive device (e.g., an integrated passive device (IPD)). In various embodiments, the interposer structure electrically connects the device dies to another component (e.g., a motherboard or the like) through a core substrate. By bonding the device dies directly to the interposer structure, yield loss of separately packaging expensive device dies may be reduced. Further by integrating the passive device within the interposer structure, power/insertion loss can be reduced and/or circuit speed can be increased, thereby enhancing package performance. Gains can also be achieved by placing the passive device die within closer proximity to the device dies. The intermediate stages of forming the packages are illustrated, in accordance with some embodiments. Some variations of some embodiments are discussed. Throughout the various views and illustrative embodiments, like reference numbers are used to designate like elements formed using like processes.

FIG. 1 illustrates a cross-sectional view of an interconnect device 50, in accordance with some embodiments. The interconnect device 50 will be incorporated into an interposer structure 200 (see FIG. 11) in subsequent processing to form a semiconductor package 250 (see FIGS. 14A and 14B). The interconnect device 50 provides electrical connection between devices directly bonded to the interposer structure 200 in the semiconductor package 250, such as between a logic die 54A and a memory die 54B (see FIGS. 14A and 14B). The interconnect device 50 may be formed using applicable manufacturing processes. The interconnect device 50 may be free of active devices and/or free of passive devices. For example, the interconnect device 50 may be free of any transistors, diodes, and/or the like. Further, the interconnect device 50 may or may not also be free of any capacitors, resistors, inductors, and/or the like. In some embodiments, the interconnect device 50 may have a thickness that is between about 10 μm and about 300 μm. In some embodiments, an interconnect device 50 may have lateral dimensions between about 1 mm by 1 mm and about 10 mm by 100 mm.

Still referring to FIG. 1, the interconnect device 50 may include an interconnect structure 62 formed on a substrate 60. The substrate 60 may be, for example, a glass substrate, a ceramic substrate, a semiconductor substrate, or the like. In some embodiments, the substrate 60 may be a silicon wafer or an active layer of a semiconductor-on-insulator (501) substrate, or the like. The substrate 60 may include a semiconductor material, such as doped or undoped silicon, or may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, multiple interconnect devices 50 may be formed on a single substrate 60 and singulated in to form individual interconnect devices 50, such as the individual interconnect device 50 shown in FIG. 1A. The substrate 60 may be referred to as having a front side or front surface (e.g., the side facing upwards in FIG. 1A), and a back side or back surface (e.g., the side facing downwards in FIG. 1A). In embodiments where the substrate 60 comprises silicon, the interconnect device 50 may also be referred to as a silicon bus or a silicon bridge.

In some embodiments, the interconnect device 50 comprises one or more layers of electrical routing 64 (e.g., conductive lines and/or vias) in the interconnect structure 62 formed over the substrate 60. The electrical routing 64 may be formed of one or more layers of conductive lines in a dielectric (e.g., low-k dielectric material) material with conductive vias interconnecting the layers of conductive lines. For example, the electrical routing 64 may include one to three layers of conductive lines. In other embodiments, the electrical routing 64 may include a different number of layers of conductive lines. The conductive vias may extend through the dielectric to provide vertical connections between layers of conductive lines. The electrical routing 64 may be formed through any suitable process (such as deposition, damascene, dual damascene, or the like).

In some embodiments, the electrical routing 64 is formed using a damascene process in which a respective dielectric layer is patterned and etched utilizing photolithography techniques to form trenches corresponding to the desired pattern of metallization layers and/or vias. An optional diffusion barrier and/or optional adhesion layer may be deposited and the trenches may be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the metallization layers may be formed by depositing a seed layer of copper or a copper alloy, and filling the trenches by electroplating. A chemical mechanical planarization (CMP) process or the like may be used to remove excess conductive material from a surface of the respective dielectric layer and to planarize the surface for subsequent processing.

In some embodiments, the use of a damascene or dual damascene process can form electrical routing 64 having a smaller pitch (e.g., "fine-pitch routing"), which can increase the density of the electrical routing 64 and also may allow for improved conduction and connection reliability within the interconnect device 50. For example, the electrical routing 64 may have a pitch (e.g., spacing between adjacent conductive lines) in the range of about 0.1 µm to about 5 µm. In some cases, during high-speed operation (e.g., greater than about 2 Gbit/second), electrical signals may be conducted near the surfaces of conductive components. Fine-pitch routing may have less surface roughness than other types of routing, and thus can reduce resistance experienced by higher-speed signals and also reduce signal loss (e.g., insertion loss) during high-speed operation. This can improve the performance of high-speed operation, for example, of Serializer/Deserializer ("SerDes") circuits or other circuits that may be operated at higher speeds. As such, when the interconnect structure 50 is integrated in the interposer device 200, the interconnect structure 50 may provide high speed signal routing between device dies bonded to the interposer structure 200 (see FIGS. 14A and 14B).

In some embodiments, the interconnect device 50 further includes pads 68, such as aluminum pads, to which external connections are made. The pads 68 may be formed on the interconnect structure 62 and electrically connected to the electrical routing 64. In some embodiments, one or more passivation films 66 are formed on portions of the interconnect structure 62 and the pads 68. Openings extend through the passivation films 66 to the pads 68, and conductive connectors 71 extend through the openings in the passivation films 66 to contact the pads 68.

In some embodiments, the conductive connectors 71 comprises metal pads or metal pillars (such as copper pillars) 70 with solder regions 72 disposed thereon. In some embodiments, the metal pillars 70 may have substantially vertical sidewalls. Alternatively, the metal pillars 70 may be omitted, and the solder regions 72 may be disposed directly on the pads 68. The solder regions 72 may facilitate testing of interconnect devices 50.

In some embodiments, the conductive connectors 71 may include a conductive material such as solder, copper, aluminum, gold, nickel, silver, palladium, tin, the like, or a combination thereof. In some embodiments, a metal cap layer is formed on the top of the metal pillars 70. The metal cap layer may include nickel, tin, tin-lead, gold, silver, palladium, indium, nickel-palladium-gold, nickel-gold, the like, or a combination thereof and may be formed by a plating process. In some embodiments, the conductive connectors 71 are formed using a plating process.

FIGS. 2 through 11 illustrate cross-sectional views of intermediate steps during a process for forming an interposer structure 200 incorporating interconnect devices 50 in accordance with some embodiments. In FIG. 1, a carrier substrate 100 is provided. The carrier substrate 100 may be a glass carrier substrate, a ceramic carrier substrate, a wafer (e.g., a silicon wafer), or the like. As shown in FIG. 2, a release layer 102 may be formed over the carrier substrate 100. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the first carrier substrate 100, or may be the like. The top surface of the release layer 102 may be leveled and may have a high degree of planarity.

Still referring to FIG. 2, a seed layer 104 is formed on the release layer 102. In some embodiments, the seed layer 104 is a metal layer, which may be a single layer or a composite layer comprising a plurality of sub-layers formed of different materials. In a particular embodiment, the seed layer 104 comprises a titanium layer and a copper layer over the titanium layer. The seed layer 104 may be formed using, for example, physical vapor deposition (PVD) or the like.

In FIG. 3, an optional dielectric layer 106 may be formed on the seed layer 104. The bottom surface of the dielectric layer 106 may be in contact with the top surface of the seed layer 104. In some embodiments, the dielectric layer 106 is formed of a polymer, such as polybenzoxazole (PBO), polyimide, benzocyclobutene (BCB), or the like. In other embodiments, the dielectric layer 106 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 106 may be formed by any acceptable deposition process, such as spin coating, CVD, laminating, the like, or a combination thereof.

The dielectric layer 106 is then patterned to form openings 108 exposing portions of the seed layer 104. The patterning may be formed by an acceptable process, such as by exposing the dielectric layer 106 to light when the dielectric layer 106 is a photo-sensitive material or by etching using, for example, an anisotropic etch. If the dielectric layer 106 is a photo-sensitive material, the dielectric layer 106 can be developed after the exposure. A curing process may be applied to harden the dielectric layer 106 after the openings 108 are formed. Alternatively, the dielectric layer 106 may be patterned using another method, such as, etching, laser drilling, or the like.

Figure 4:
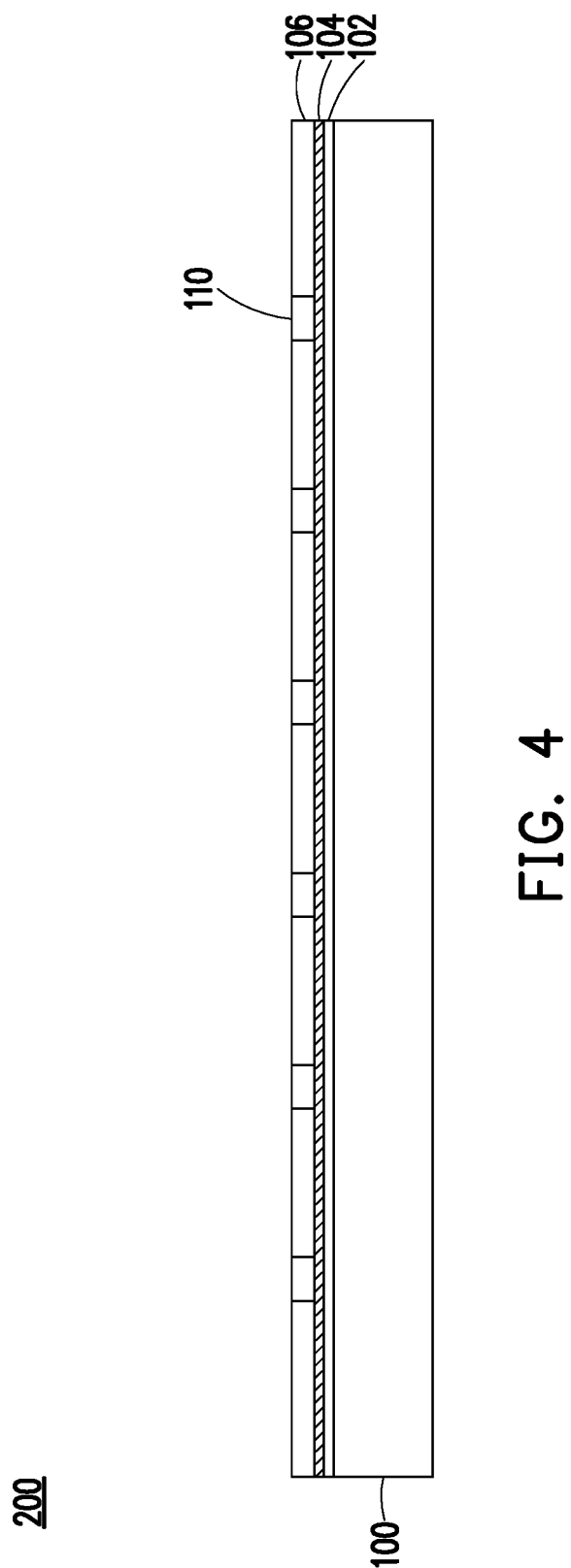

In FIG. 4, optional pre-solder regions 110 are formed in the openings 108. In some embodiments, the pre-solder regions 110 may comprise Sn—Ag, Sn—Cu, Sn—Ag—Cu, combinations thereof, or the like. The pre-solder regions 110 may be formed through electroplating in the openings 108 using the exposed portions of seed layer 104. Alternatively, the pre-solder regions 110 may be formed using a ball drop process, a mounting process, or the like with a pick and place tool. In such embodiments, the seed layer 104 may be omitted.

In FIG. 5A, a dielectric layer 112 and a metallization pattern 114 is formed over the dielectric layer 106 and the pre-solder regions 110. The metallization pattern 114 may include conductive pillars 114A within the dielectric layer 112 and conductive pads 114B above the dielectric layer 112. In some embodiments, the metallization pattern 114 also includes redistribution lines (RDLs) electrically connected to the conductive pads. In such embodiments, the RDLs of the metallization pattern 114 redistribute electrical, power, or ground signals on the top surface of dielectric layer 112.

In some embodiments, the dielectric layer 112 is formed of a polymer, such as polybenzoxazole (PBO), polyimide, benzocyclobutene (BCB), or the like. In other embodiments, the dielectric layer 112 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 112 may be formed by any acceptable deposition process, such as spin coating, CVD, laminating, the like, or a combination thereof. The material of the dielectric layer 112 may be the same or different from the material of the dielectric layer 106.

After formation, the dielectric layer 112 is then patterned to form openings exposing portions of the pre-solder regions 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure. A curing process may be applied to harden the dielectric layer 112 after the openings are formed. Alternatively, the dielectric layer 112 may be patterned using another method, such as, etching, laser drilling, or the like.

The metallization pattern 114 is then formed. As an example to form the metallization pattern 114, a seed layer (not shown) is formed over the dielectric layer 112. The seed layer may further be formed on sidewalls and a bottom surface of openings in the dielectric layer 112. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to metallization pattern 114. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 114.

FIG. 5B illustrates an alternate embodiment where the dielectric layer 106 and pre-solder regions 110 are omitted. In such embodiments, the dielectric layer 112 and the metallization pattern 114 may be formed directly on the seed layer 104. The metallization pattern 114 may be formed as described above with respect to FIG. 5A. Alternatively, the dielectric layer 106 may be formed directly on the release layer 102, and the seed layer 104 may be deposited over and within the dielectric layer 112 after the dielectric layer 112 is deposited and patterned. In such embodiments, the seed layer 106 serves as the seed layer to form the metallization pattern 114, and no separate seed layer is required.

Figure 6:
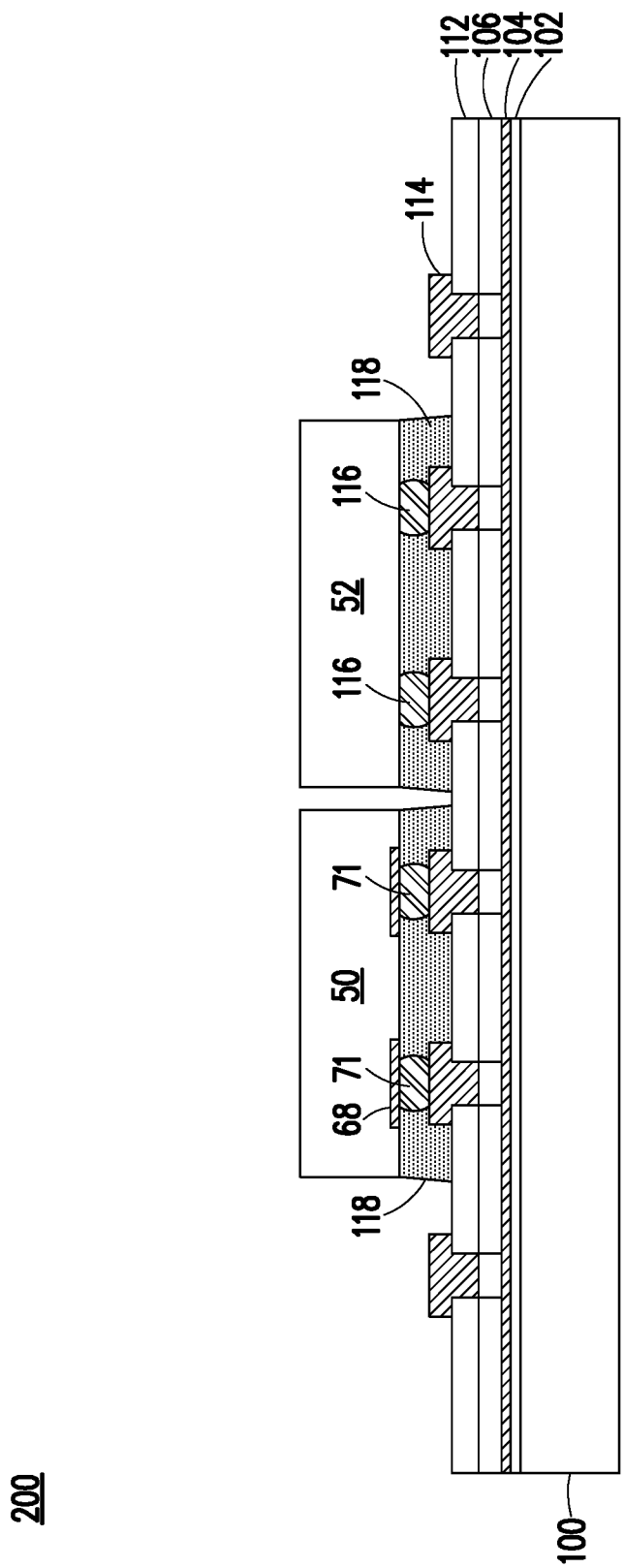

In FIG. 6, one or more interconnect devices 50 (see e.g., FIG. 1) are bonded to the metallization pattern 114 through conductive connectors 71. For example, solder regions of the conductive connectors 71 may be bonded to the metallization pattern 114 using a flip chip bonding process. A reflow process may be applied to adhere the solder regions of the conductive connectors 71 to the metallization pattern 114. Although FIG. 6 illustrates the conductive connectors 71 as comprising only solder regions, in other embodiments, the conductive connectors 71 may have a different configuration. For example, the conductive connectors 71 may include solder regions disposed on conductive pillars (see e.g., solder regions 72 on conductive pillars 70 of FIGS. 1 and 14B). The interconnect devices 50 may be used to provide electrical connections between device dies subsequently bonded to the interposer structure 200 (see FIGS. 14A and 14B).

As also illustrated in FIG. 6, a passive device 52 may also be bonded to the metallization pattern 114 through conductive connectors 116. For example, the conductive connectors 116 may comprise solder regions, which are bonded to the metallization pattern 114 using a flip chip bonding process. A reflow process may be applied to adhere the solder regions of the conductive connectors 116 to the metallization pattern 114.

The passive device 52 may be similar to the interconnecting device 50. For example, the passive device 52 may include a substrate (e.g., similar to substrate 60), an interconnect structure (e.g., similar to interconnect structure 62) formed on the substrate, and conductive connectors 116 (e.g., similar to conductive connectors 71). The conductive connectors 116 may provide electrical connections to electrical routing in the interconnect structure of the passive device 52. The electrical routing in the interconnect structure of the passive device 52 may be patterned to provide one or more passive circuit elements, such as, capacitor(s), resistor(s), inductor(s), the like, or combinations thereof. The passive device 52 may be free of any active devices (e.g., transistors).

Although only one interconnect device 50 and one passive device 52 is illustrated in FIG. 6, any number of interconnect devices 50 and/or passive devices 52 may be bonded to the metallization pattern 114. Further, the passive device 52 is optional and may be omitted depending on the package configuration. For example, the passive device 52 may be replaced with additional interconnect devices 50 in other embodiments.

Still referring to FIG. 6, an underfill 118 may be deposited around the conductive connectors 71 and 116. The underfill 118 may be formed by a capillary flow process after the interconnect device 50 and passive device 52 are attached, or may be formed by a suitable deposition method before the interconnect device 50 and passive device 52 are attached. The underfill 118 may be disposed between the interconnect device 50 and the metallization pattern 114/dielectric layer 112. The underfill 118 may further be disposed between the passive device 52 and the metallization pattern 114/dielectric layer 112. Although FIG. 6 illustrates a separate portion of the underfill 118 between each of the interconnect device 50 and the passive device 52, the underfill 118 may continuously extend under the interconnect device 50 and the passive device 52 in other embodiments.

Figure 7:
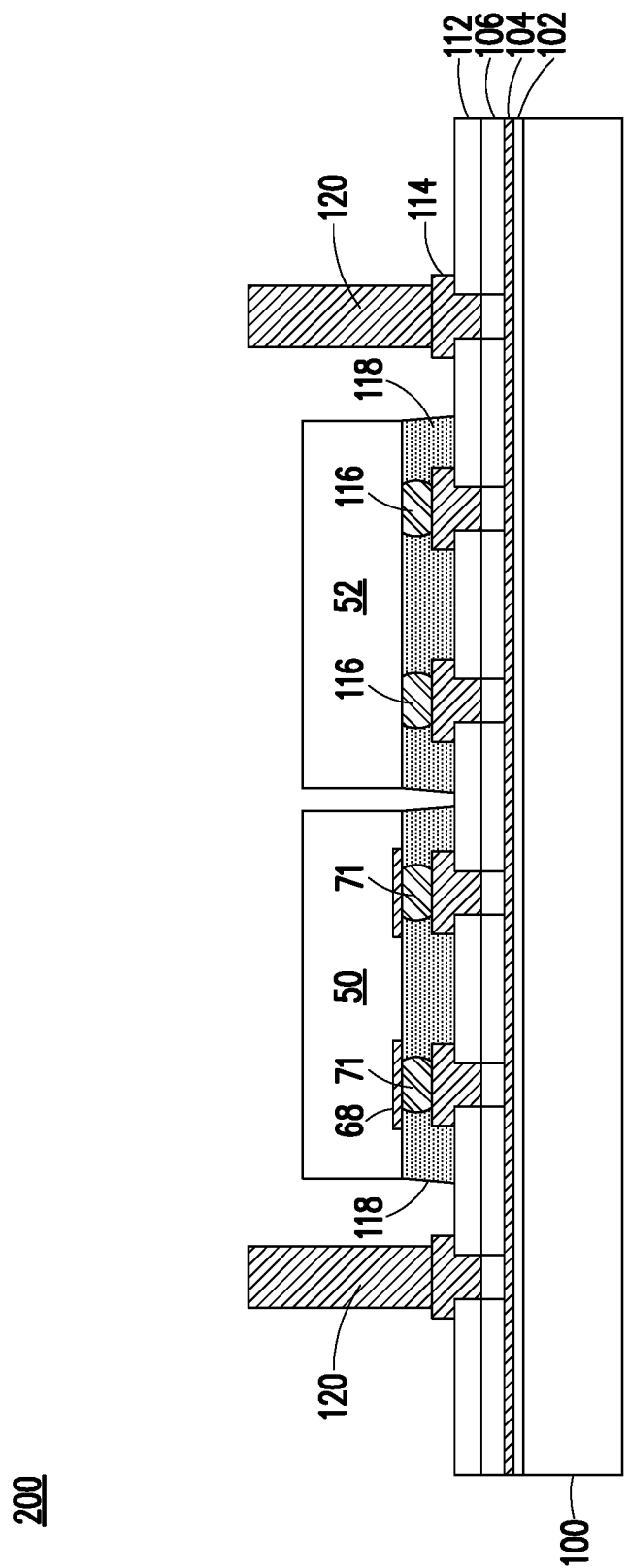

In FIG. 7, through vias 120 are formed over the metallization pattern 114. As an example to form the through vias 120, a photoresist is formed and patterned on the metallization pattern 114. The photoresist may bury the interconnect device 50 and the passive device 52. The photoresist may be formed by spin coating or the like and may be exposed to light for patterning. The pattern of the photoresist corresponds to the through vias 120. The patterning forms openings through the photoresist to expose the metallization pattern 114. A conductive material is formed in the openings of the photoresist and on the exposed portions of the metallization pattern 114. The conductive material may be formed by plating, such as electroplating or electroless plating, or the like. The conductive material may comprise a metal, like copper, titanium, tungsten, aluminum, or the like. The photoresist is then removed. The photoresist may be removed by an acceptable ashing or stripping process, such as using an oxygen plasma or the like. The conductive material form the through vias 120. In FIG. 7, the through vias 120 extend higher than top surfaces of the interconnect device 50 and the passive device 52. Other configurations are also possible.

Figure 8:
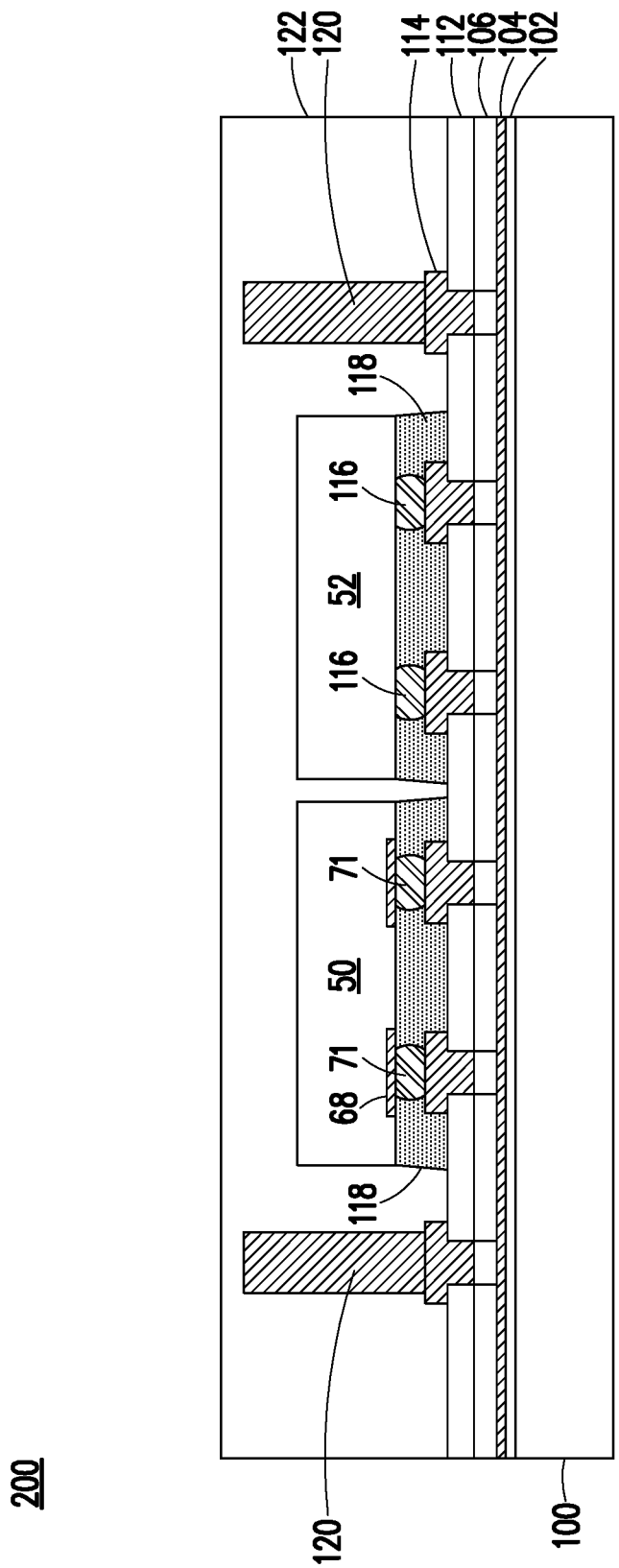

In FIG. 8, a dielectric film 122 is formed over and around the interconnect device 50, the passive device 52, and the through vias 120. The dielectric film 122 may fill gaps between the interconnect device 50, the passive device 52, and the through vias 120, and the dielectric film 122 may further bury the interconnect device 50, the passive device 52, and the through vias 120. In some embodiments, the dielectric film 122 is formed of a polymer, such as polybenzoxazole (PBO), polyimide, benzocyclobutene (BCB), or the like. In other embodiments, the dielectric film 122 is an underfill, which may or may not comprise a filler material (e.g., silicon oxide). In still other embodiments, the dielectric film 122 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric film 122 may be formed by any acceptable deposition process, such as lamination, spin coating, CVD, the like, or a combination thereof. Optionally, the dielectric film 122 may be cured after deposition. In other embodiments, the dielectric film 122 may be replaced with a molding compound, epoxy, or the like, which may be applied by compression molding, transfer molding, lamination, or the like.

Figure 9:
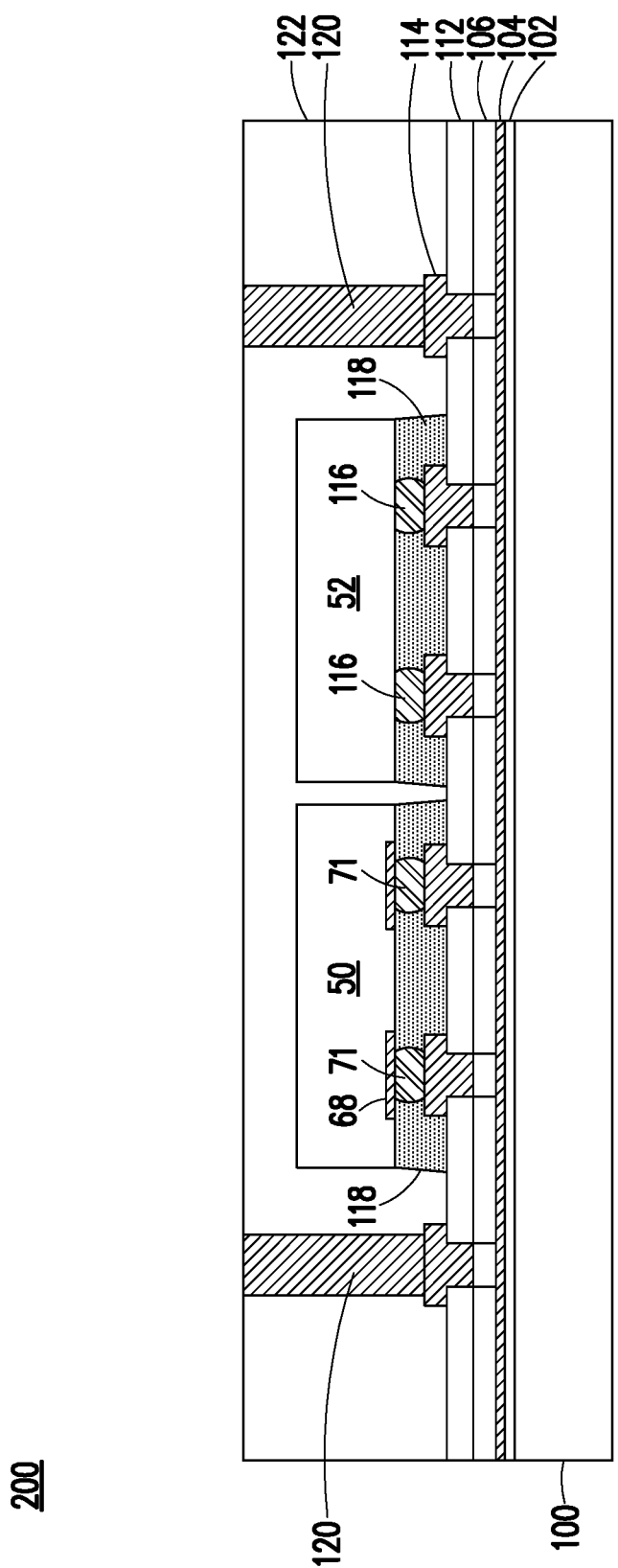

In FIG. 9, a planarization process is performed on the dielectric film 122 to expose the through vias 120. The planarization process may also remove material of the through vias 120. Top surfaces of the through vias 120 and the dielectric film 122 may be coplanar after the planarization process. The planarization process may be, for example, a chemical-mechanical polish (CMP), a grinding process, or the like. In some embodiments, the planarization may be omitted, for example, if the through vias 120 are already exposed after the dielectric film 122 is deposited.

Figure 10:
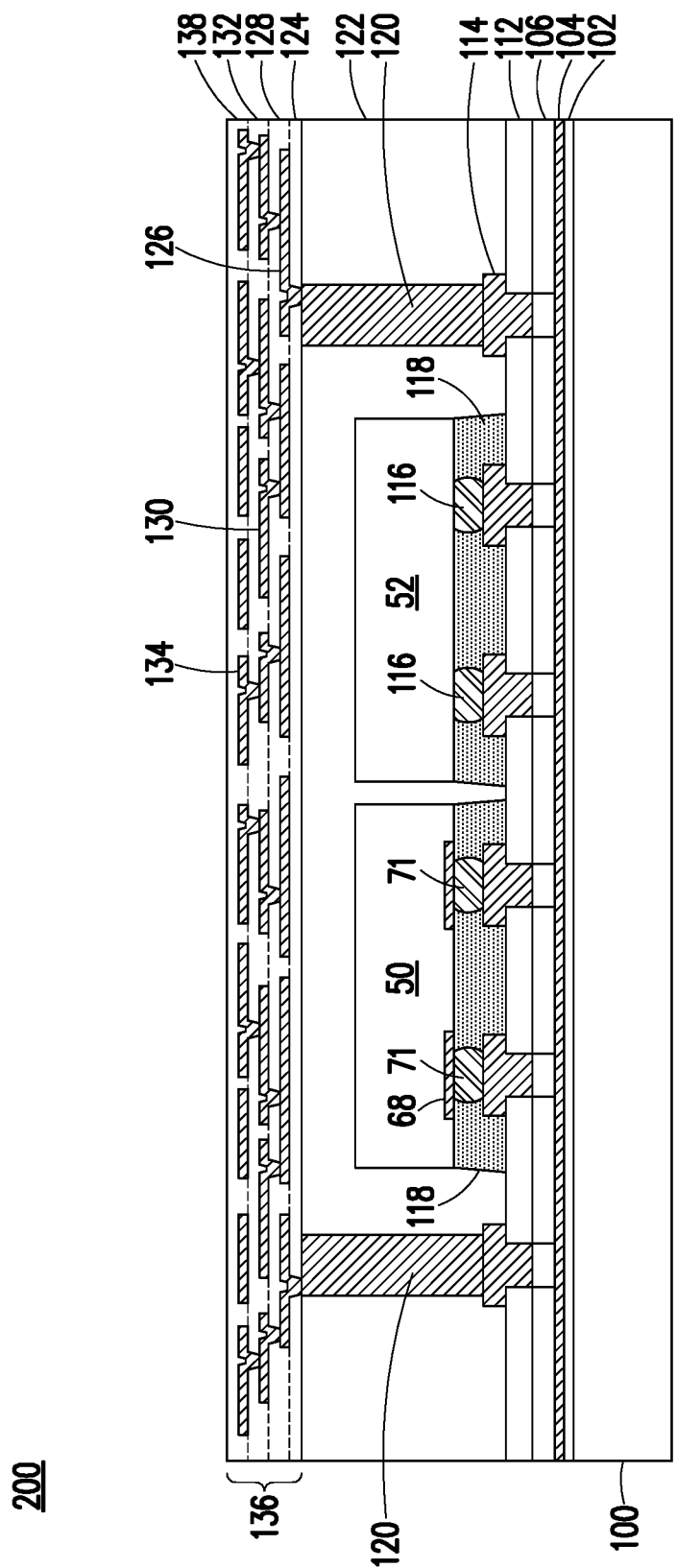

In FIG. 10, an interconnect structure 136 is formed over the dielectric film 122, the through vias 120, the interconnect device 50, and the passive device 52. In the embodiment shown, the interconnect structure 136 includes dielectric layers 124, 128, 132, and 138 and metallization patterns 126, 130, and 134 (sometimes referred to as redistribution layers or redistribution lines). Specifically, the dielectric layer 124 is formed over the dielectric film 122; the dielectric layer 128 is formed over the dielectric layer 124 and the metallization pattern 126; the dielectric layer 132 is formed over the dielectric layer 128 and the metallization pattern 130; and the dielectric layer 138 is formed over the dielectric layer 132 and the metallization pattern 134. Further via portions of the metallization pattern 134 extends through the dielectric layer 132; via portions of the metallization pattern 130 extends through the dielectric layer 128; and via portions of the metallization pattern 126 extends through the dielectric layer 124.

The dielectric layers 124, 128, 132, and 138 may be formed using similar materials and similar processes as the dielectric layer 112 and further description of the dielectric layers 124, 128, and 132 is omitted for brevity.

The metallization patterns 126, 130, and 134 may be formed using similar materials and similar processes as the metallization pattern 114 and further description of the metallization patterns 126, 130, and 134 is omitted for brevity. The metallization patterns 126, 130, and 134 may be electrically connected to the through vias 120, which electrically connects the metallization patterns 126, 130, and 134 to the metallization pattern 114, the interconnect device 50, and the passive device 52. The metallization patterns 126, 130, and 134 may provide conductive lines, which provide signal routing, power lines, and/or ground lines in the completed package 250 (see FIGS. 14A and 14B). In some embodiments, one or more of the metallization patterns 126, 130, or 134 may provide fine-pitched conductive lines for fine-pitched routing. For example, a pitch of one or more of the metallization patterns 126, 130, or 134 may be in a range of 20 µm to 100 µm.

It should be appreciated that the second interconnect structure 136 may include any number of dielectric layers and metallization patterns. If more dielectric layers and metallization patterns are to be formed, steps and processes similar to those discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 11:
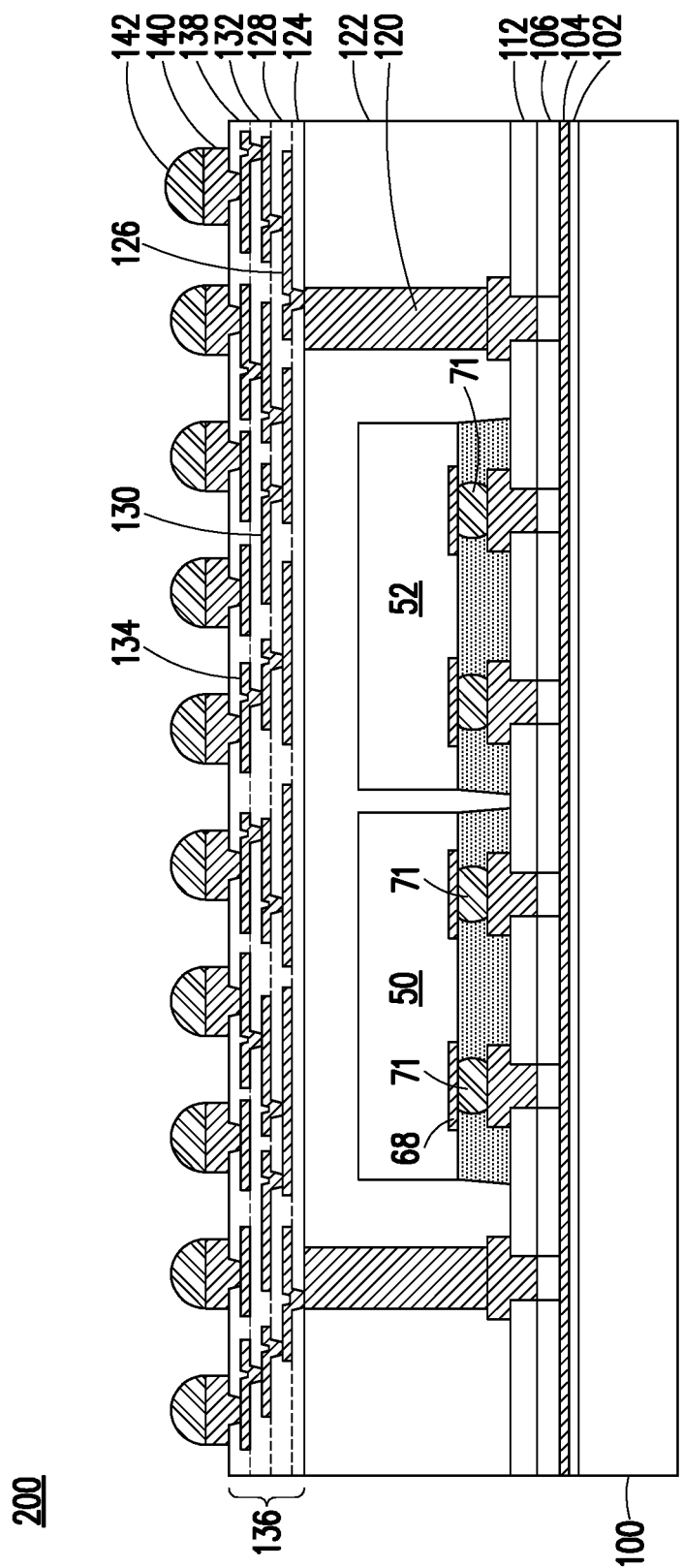

In FIG. 11, under-bump metallizations (UBMs) 140 and conductive connectors 142 are formed for external connection to the second interconnect structure 136, in accordance with some embodiments. In an example of forming the UBMs 140, the dielectric layer 138 is first patterned to form openings exposing portions of the metallization pattern 134. The patterning may be performed using an acceptable process, such as by exposing the dielectric layer 138 to light when the dielectric layer 138 is a photo-sensitive material or by etching using, for example, an anisotropic etch. If the dielectric layer 138 is a photo-sensitive material, the dielectric layer 138 can be developed after the exposure.

The UBMs 140 have bump portions on and extending along the major surface of the dielectric layer 138, and have via portions extending through the dielectric layer 138 to physically and electrically couple the metallization pattern 134. As a result, the UBMs 140 are electrically coupled to the metallization pattern 134. The UBMs 140 may be formed of the same material as the metallization pattern 134, and may be formed using a similar process (e.g., plating). In some embodiments, the UBMs 140 have a different size (e.g., width, thickness, etc.) than the metallization pattern 134.

The conductive connectors 142 are then formed on the UBMs 140, in accordance with some embodiments. The conductive connectors 142 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 142 may include a conductive material such as solder, copper, aluminum, gold, nickel, silver, palladium, tin, the like, or a combination thereof. In some embodiments, the conductive connectors 142 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 142 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the conductive connectors 142 may be larger than (e.g., have a larger pitch than) the solder regions 72. Thus, an interposer structure 200 incorporating the interconnect device 50 and the passive device 52 is formed. An entirety of the interposer structure 200 may be free of active devices in some embodiments.

FIGS. 12A through 14B illustrate intermediate steps of bonding the interposer structure 200 to a core substrate 152 as well as bonding device dies to the interposer structure 200. Thus, a semiconductor package 250 is formed.

Figure 12A:
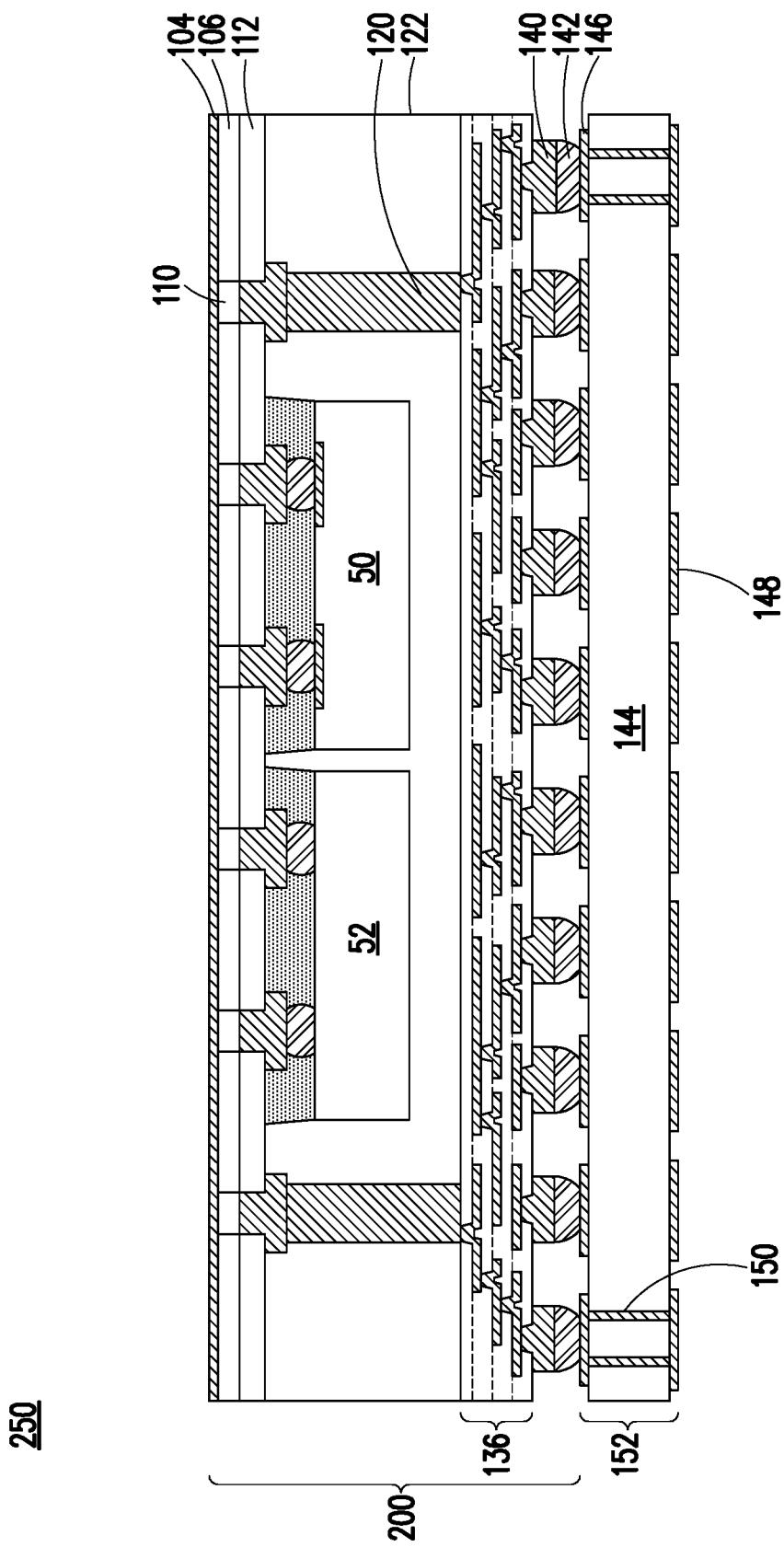
FIGS. 12A, 12B, 13A, 13B, 14A, 14B, and 16 illustrate a varying views of intermediate steps of manufacturing of a package incorporating the interposer structure in accordance with some embodiments.
Figure 12B:
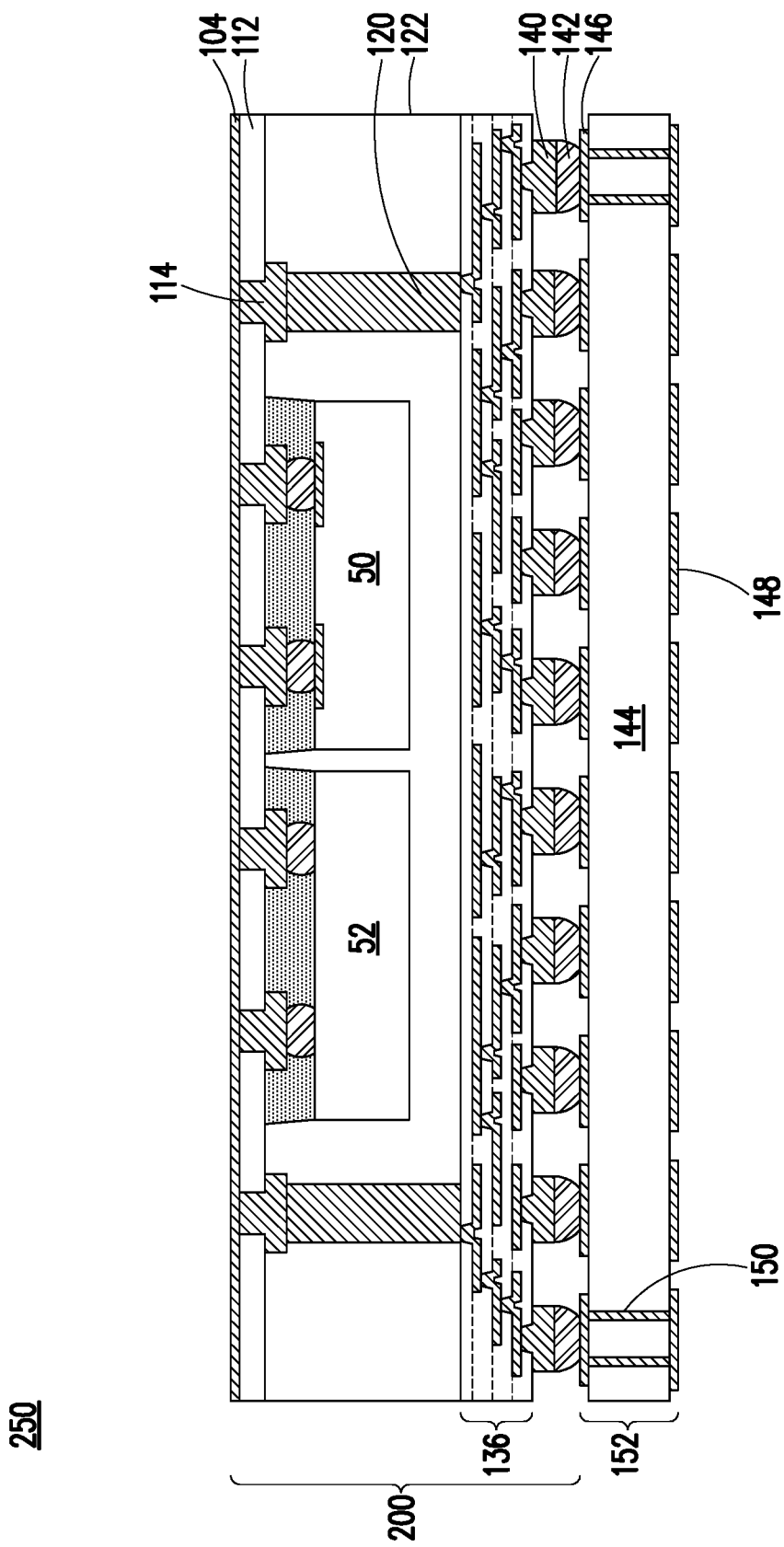

In FIGS. 12A and 12B, a carrier substrate de-bonding is performed to detach (or "de-bond") the carrier substrate 100 from the interposer structure 200. In accordance with some embodiments, the de-bonding includes projecting a light such as a laser light or an UV light on the release layer 102 so that the release layer 102 decomposes under the heat of the light and the carrier substrate 100 can be removed.

The structure is then flipped over and bonded to a core substrate 152. The core substrate 152 may be a metal-clad insulated base material such as a copper-clad epoxy-impregnated glass-cloth laminate, a copper-clad polyimide-impregnated glass-cloth laminate, or the like. For example, the core substrate 144 may include metal cladding layers 146 and 148 on opposing surfaces of a base material 144. The metal cladding layers 146 and 148 may be patterned to provide electrical routing on the top and bottom surfaces of the base material 144. Patterning metal cladding layers 146 and 148 may be performed using any suitable process such as wet etching, laser etching, or the like. The conductive connectors 142 may be directly bonded to the metal cladding layer 146 using, for example, a flip chip bonding process. In some embodiments, no intervening layers (e.g., build-up layers) are formed between metal cladding layer 146 of the core substrate 152 and the conductive connectors 144 of the interposer structure 200.

The core substrate 144 may further include through vias 150, which extend through the base material 144. As an example to form the through vias 150, openings are formed through the base material includes using a mechanical drilling or milling process. Next, the openings may be plated with a metallic material, for example, using an electrochemical plating process. In some embodiments, the metallic material may comprise copper. The plating of openings may form through vias 150 for providing electrical connections from one side of core substrate 144 to another. After plating, remaining portions of the openings through the base material may optionally be filled with an insulating material.

Flipping the interposer structure 200 exposes the seed layer 104. FIG. 12A illustrates an embodiment where the dielectric layer 106 and the pre-solder regions 110 are included in the interposer structure 200. FIG. 12B illustrates an alternate embodiment where the dielectric layer 106 and the pre-solder regions 110 are omitted such that the seed layer contacts the dielectric layer 104 and the metallization pattern 114.

Figure 13A:
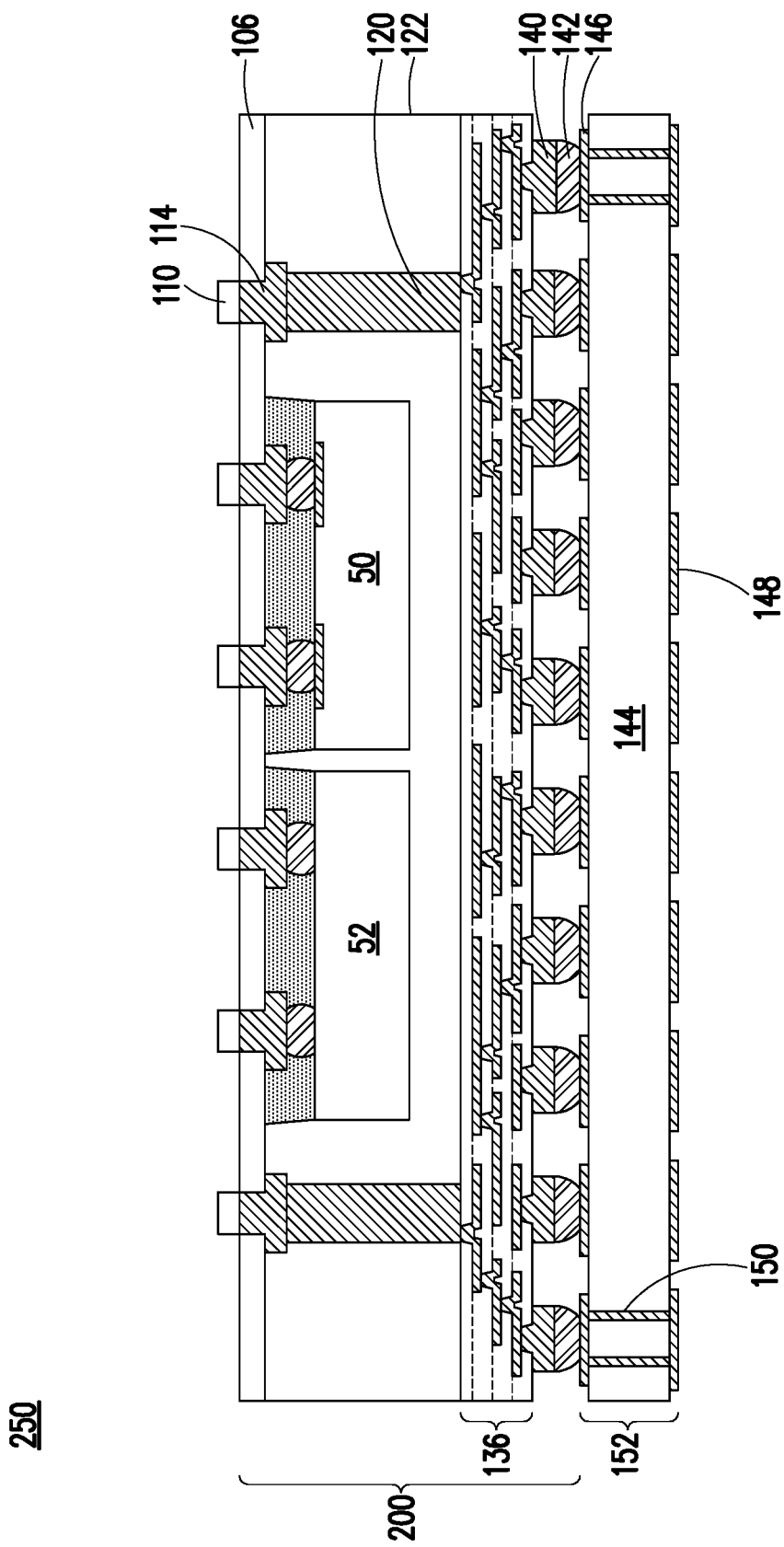
Figure 13B:
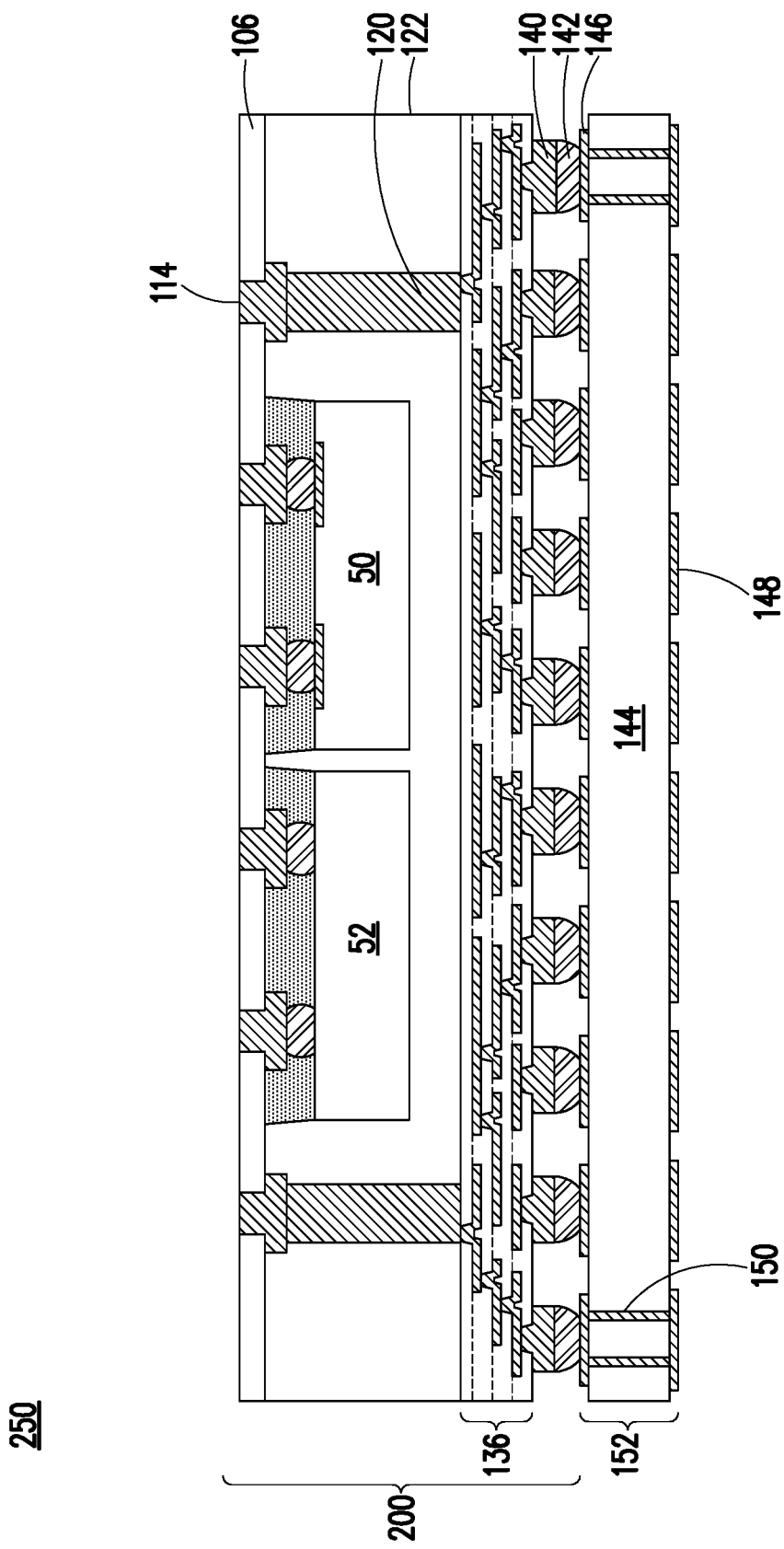

In FIGS. 13A and 13B, the seed layer 104 and the dielectric layer 106 (if present) are removed using a suitable process, for example, a plasma etching process, a wet etching process, or the like. In FIG. 13A, which corresponds to the embodiment of FIG. 12A, the dielectric layer 106 is removed to expose the pre-solder regions 110. In this embodiment, removing the dielectric layer 106 may use an etching process that selectively etches the dielectric layer 106 at a faster rate than the pre-solder regions 110. In FIG. 13B, which corresponds to the embodiment of FIG. 12B, the seed layer 104 is removed to expose the metallization pattern 114.

Figure 14A:
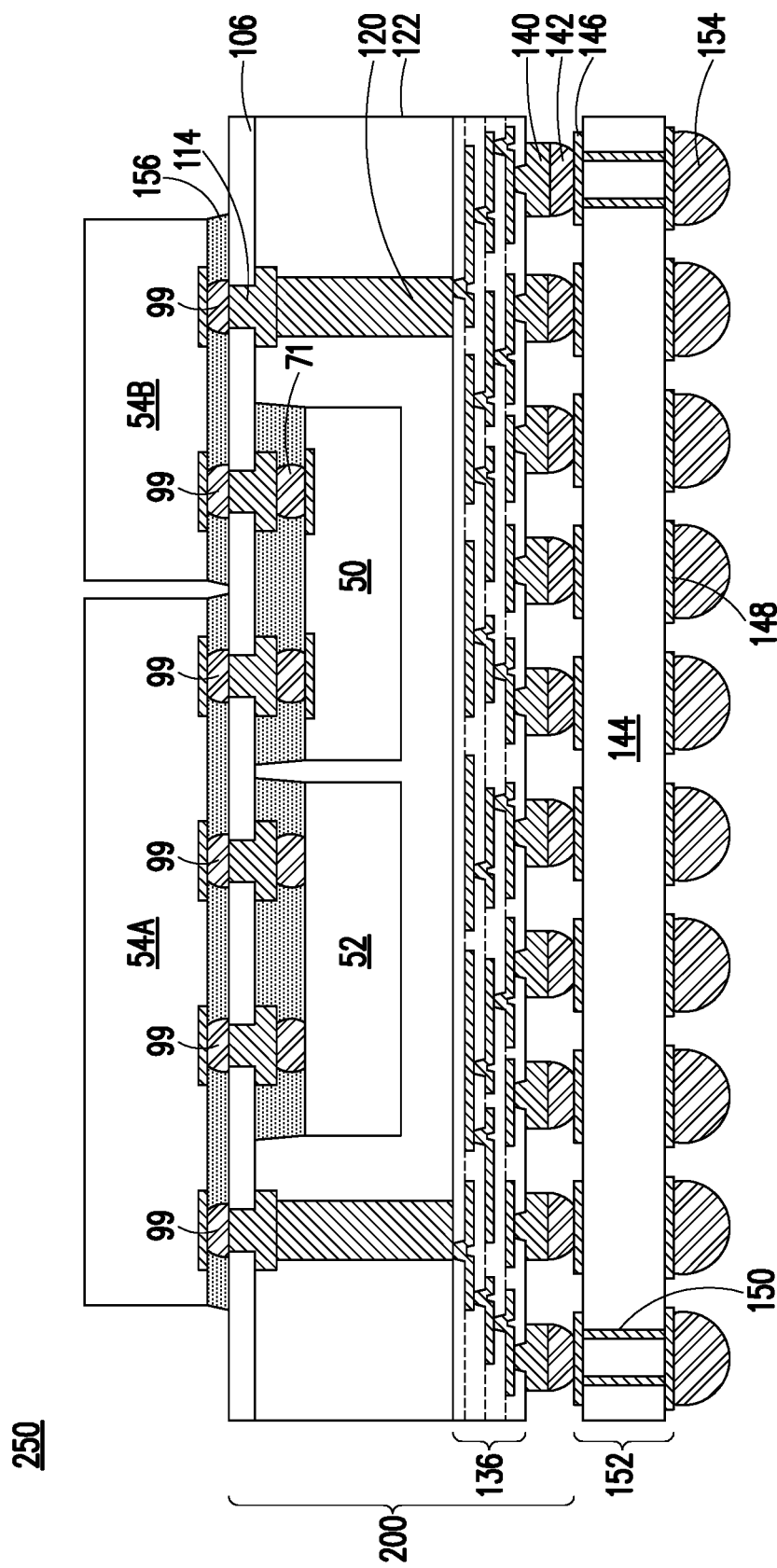
Figure 14B:
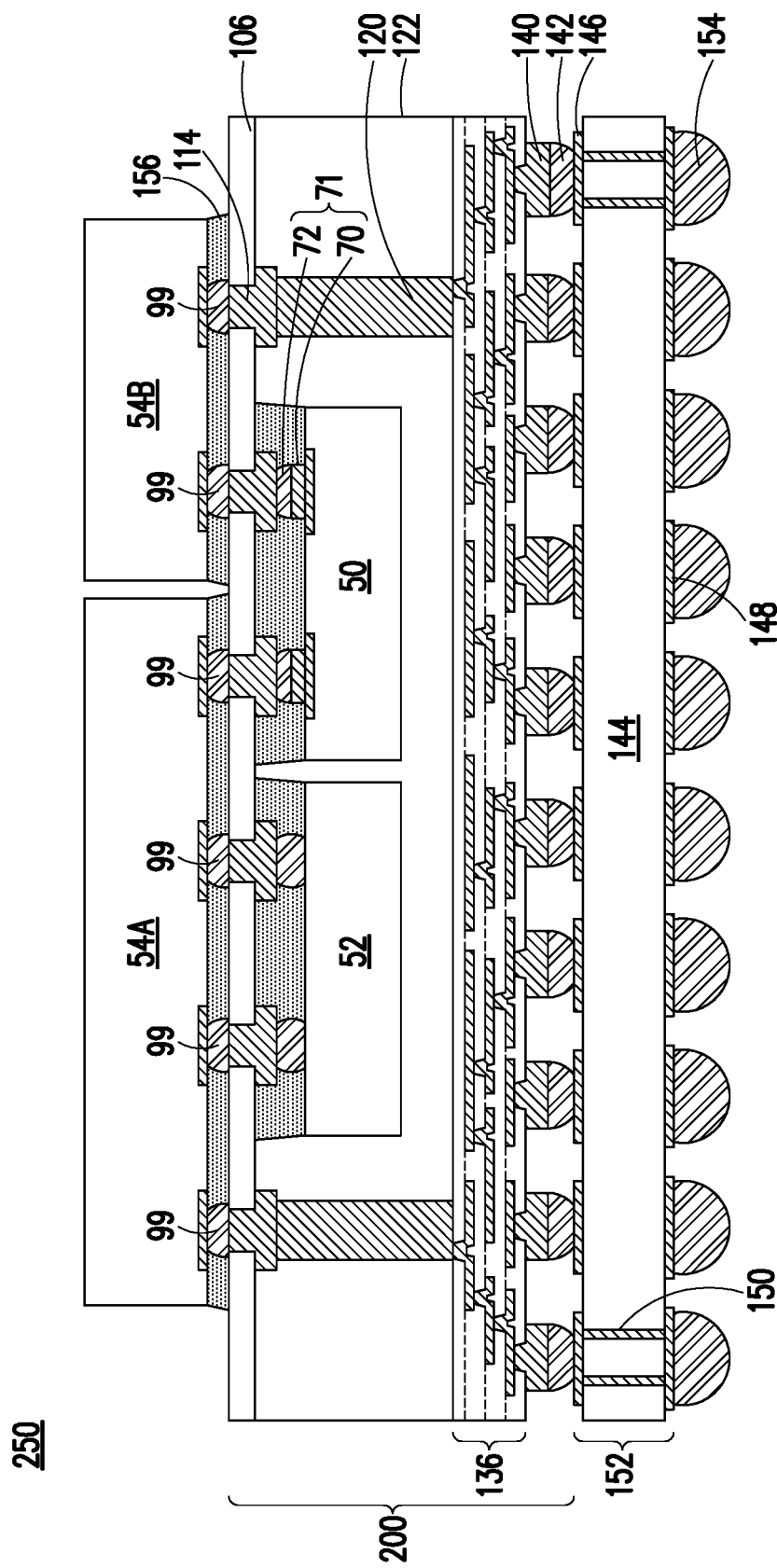

In FIGS. 14A and 14B, device dies 54A and 54B are bonded to the metallization pattern 114 through conductive connectors 99. For example, the conductive connectors 99 may comprise solder regions, which are bonded to the metallization pattern 114 using a flip chip bonding process. A reflow process may be applied to adhere the solder regions of the conductive connectors 99 to the metallization pattern 114. In some embodiments, the conductive connectors 99 may be a same size as (e.g., have a same pitch as) the solder regions 72. In some embodiments, the conductive connectors 99 may be smaller than (e.g., have a smaller pitch than) the conductive connectors 142. FIG. 14A illustrates an embodiment where the conductive connectors 71 of the interconnect device 50 includes only solder regions 72. FIG. 14B illustrates an alternate embodiment where the conductive connectors 71 of the interconnect device includes solder regions 72 disposed on conductive pillars 70.

Figure 15:
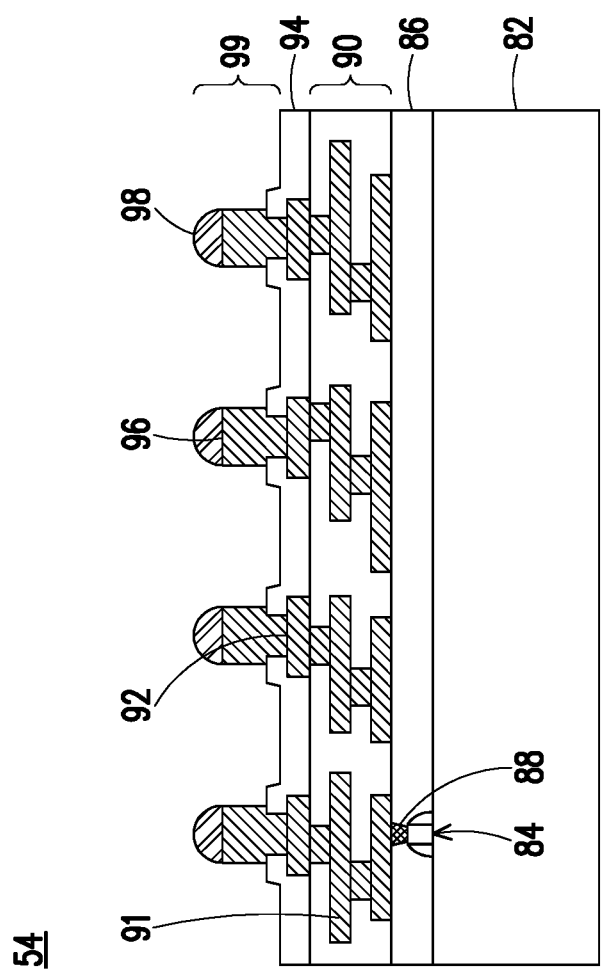
FIG. 15 illustrates a cross-sectional view of a device die in accordance with some embodiments.

The device dies 54A and 54B may be similar to the interconnecting device 50. For example, FIG. 15 illustrates a detailed view of a device die 54 (e.g., device dies 54A and 54B). The device die 54 may include a substrate 82 (e.g., similar to substrate 60), an interconnect structure 90 (e.g., similar to interconnect structure 62) formed on the substrate 82, pads 92 (e.g., similar to pads 68, a passivation layer 94 (e.g., similar to passivation layer 66), and conductive connectors 99 (e.g., similar to conductive connectors 71). However, unlike the interconnecting device 50, the device die 54 includes active devices 84 (e.g., transistors) on a top surface of the substrate 82. The active devices 84 are formed in a dielectric layer 86, and the active devices 84 are electrically connected to electrical routing 91 by conductive vias 88. The electrical routing 91 in the interconnect structure 90 may provide circuit structures. For example, the device die 54 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, a multi-functional die, or combinations thereof.

Referring back to FIG. 14A, a logic die 54A and a memory die 54B are flip chip bonded to the metallization pattern 114. The interconnect device 50 is electrically connected to both the logic die 54A and the memory die 54B, and the interconnect device 50 provides fine-pitched electrical interconnection between the logic die 54A and the memory die 54B. In various embodiments, the interconnect device 50 may allow for high speed routing between adjacent device dies 54 bonded to the interposer structure 200. Further, the passive device 52 is electrically connected to the logic die 54A and/or the memory die 54B. By placing the passive device 52 within the interposer structure 200, a distance between the passive device 52 and the device dies 54 may be reduced, improving electrical performance in the completed package.

Figure 16:
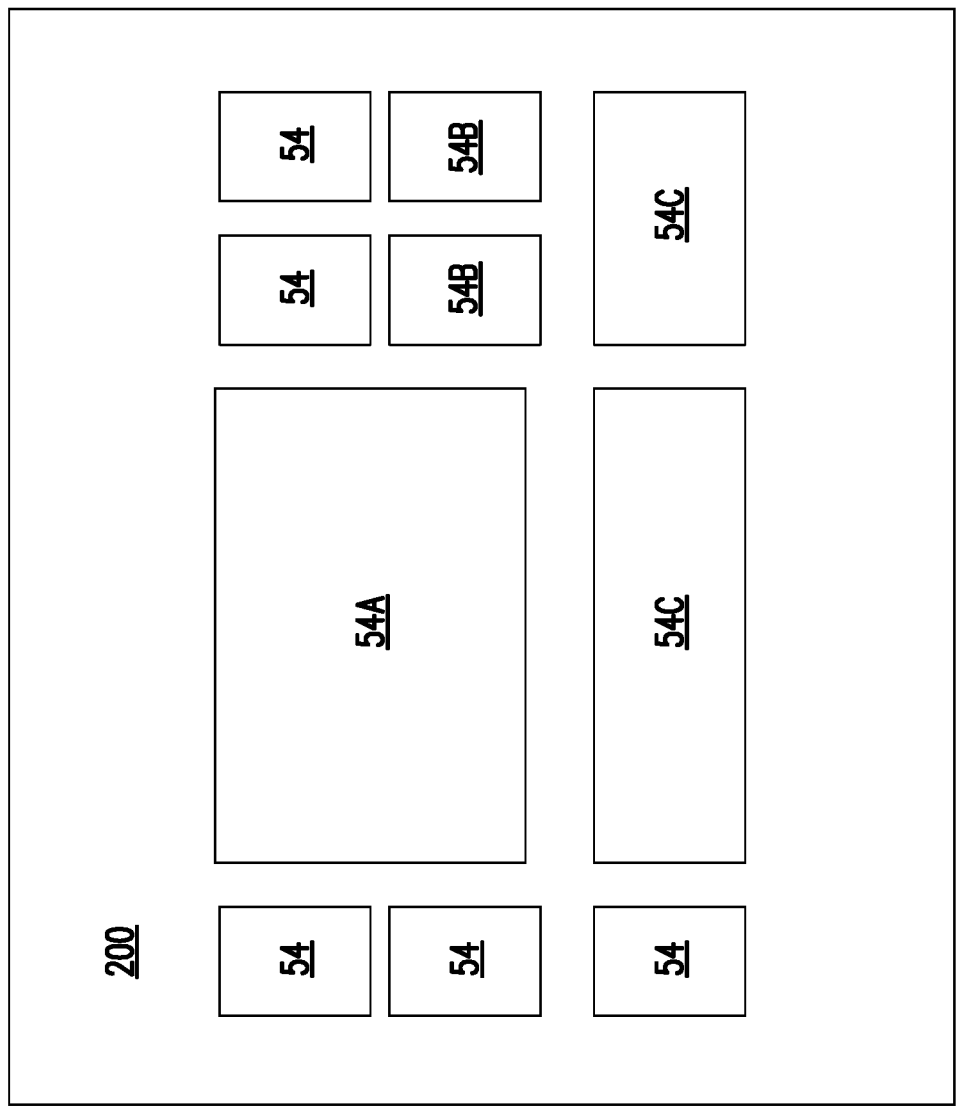

Although only one logic die 54A and one memory die 54B is illustrated in FIGS. 14A and 14B, any number of interconnect devices 50 may be bonded to the metallization pattern 114. Further, other types of device dies 54 may be bonded to the metallization pattern 114 as well. For example, FIG. 16 illustrates a top down view of dies 54 bonded to the interposer structure 200. Dies 54 includes logic dies 54A, memory dies 54B, multi-functional dies 54C, and the like. Other configurations are also possible in other embodiments. One or more interconnect devices 50 may provide electrical interconnection between adjacent ones of the device dies 54 bonded to the interposer structure 200.

Referring back to FIGS. 14A and 14B, an underfill 156 may be deposited around the conductive connectors 99. The underfill 156 may be formed by a capillary flow process after the device dies 54 are attached, or may be formed by a suitable deposition method before the device dies 54 are attached. The underfill 156 may be disposed between the device dies 54 and the interposer structure 200. Although FIGS. 14A and 14B illustrate a separate portion of the underfill 156 under each device die 54, the underfill 156 may continuously extend under multiple device dies 54 in other embodiments.

As also illustrated in FIGS. 14A and 14B, conductive connectors 154 are formed on the metal cladding layer 148 of the core substrate 152. The conductive connectors 154 may be used to bond the completed package 250 to another structure, such as, a package substrate, a motherboard, or the like. The conductive 154 may be, for example, BGA connectors, solder balls, metal pillars, C4 bumps, micro bumps, ENEPIG formed bumps, or the like. The conductive connectors 154 may include a conductive material such as solder, copper, aluminum, gold, nickel, silver, palladium, tin, the like, or a combination thereof. In some embodiments, the conductive connectors 154 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 154 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the conductive connectors 154 may be larger than (e.g., have a larger pitch than) the conductive connectors 142. Thus, a package 250 may be formed according to various embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The package 250 allows the incorporation of interconnect devices 50 to provide improved high-speed transmission of electrical signals between components (e.g., device dies 54) bonded to an interposer structure. The incorporation of interconnect devices 50 can improve the high-speed operation of the package 250. By bonding the device dies directly to the interposer structure, yield loss of separately packaging expensive device dies may be reduced. Further by integrating the passive device within the interposer structure, power/insertion loss can be reduced and/or circuit speed can be increased, thereby enhancing package performance. Gains can also be achieved by placing the passive device die within closer proximity to the device dies.

In accordance with some embodiments, a package includes an interposer structure free of any active devices. The interposer structure includes an interconnect device; a dielectric film surrounding the interconnect device; and first metallization pattern bonded to the interconnect device. The package further includes a first device die bonded to an opposing side of the first metallization pattern as the interconnect device and a second device die bonded to a same side of the first metallization pattern as the first device die. The interconnect device electrically connects the first device die to the second device die. In some embodiments, the interposer structure further comprises a passive device bonded to a same side of the first metallization pattern as the interconnect device, wherein the passive device is electrically connected to the first device die or the second device die. In some embodiments, the interconnect device is flip chip bonded to the first metallization pattern. In some embodiments, the interconnect device comprises: a semiconductor substrate; and a first interconnect structure on the semiconductor substrate, wherein the first interconnect structure comprises electrical routing that electrically routes signals between the first device die and the second device die. In some embodiments, a pitch of the electrical routing is in a range of 0.1 µm to 5 µm. In some embodiments, the interposer structure further comprises: a second interconnect structure on an opposing side of the dielectric film as the first metallization pattern; and a through via extending through the dielectric film, wherein the through via electrically connects the second interconnect structure to the first metallization pattern. In some embodiments, the first device die and the second device die are each directly bonded to the first metallization pattern.

In accordance with some embodiments, a package includes an interposer free of active devices, the interposer comprising: an interconnect device comprising: a semiconductor substrate; and a first interconnect structure on the semiconductor substrate; a passive device; a dielectric film burying the interconnect device and the passive device; and a first metallization pattern over the dielectric film, the interconnect device, and the passive device, wherein the interconnect device is bonded to a first surface of the first metallization pattern by first solder regions, and the passive device is bonded to the first surface of the first metallization pattern by second solder regions; a first device die directly bonded to a second surface of the first metallization pattern by third solder regions, wherein the first surface of the first metallization pattern is opposite to the second surface of the first metallization pattern; a second device die directly bonded to the second surface of the first metallization pattern by fourth solder regions, wherein electrical routing in the first interconnect structure electrically routes signals between the first device die and the second device die; and a core substrate directly bonded to an opposing side of the interposer as the first device die and the second device die. In some embodiments, the passive device is electrically connected to the first device die or the second device die. In some embodiments, the interposer further comprises: a second interconnect structure on an opposing side of the dielectric film as the first metallization pattern; a first through via extending through the dielectric film, wherein the first through via electrically connects the second interconnect structure to the first metallization pattern; and fifth solder regions on an opposing side of the second interconnect structure as the first through via. In some embodiments, the core substrate comprises: an insulating core material; a first metal cladding layer on a first side of the insulating core material; a second metal cladding layer on a second side of the insulating core material opposite the first side of the insulating core material; and a second through via extending through the insulating core material, wherein the second through via electrically connects the first metal cladding layer to the second metal cladding layer. In some embodiments, fifth solder regions of the interposer are directly bonded to the first metal cladding layer. In some embodiments, the package further includes sixth solder regions directly contacting the second metal cladding layer. In some embodiments, the interposer further comprises: a first underfill around the first solder regions; and a second underfill around the second solder regions. In some embodiments, the first underfill is physically separated from the second underfill. In some embodiments, the package further includes a third underfill around the third solder regions; and a fourth underfill around the fourth solder regions.

In accordance with some embodiments, a method includes bonding an interconnect device to a first surface of a first metallization pattern, the interconnect device is free of any active devices; bonding a passive device to the first surface of the first metallization pattern, the passive device is free of any active devices; burying the interconnect device and the passive device in a dielectric film; bonding a first device die to a second surface of the first metallization pattern, the second surface is opposite the first surface; and bonding a second device die to the second surface of the first metallization pattern, wherein the interconnect device electrically routes signals between the first device die and the second device die. In some embodiments, the method further includes forming a through via on the first metallization pattern; burying the through via in the dielectric film; and forming an interconnect structure over the dielectric film, wherein the through via electrically connects the first metallization pattern to the interconnect structure. In some embodiments, the method further includes bonding a core substrate to an opposing side of the interconnect structure as the dielectric film. In some embodiments, the core substrate comprises: an insulating core material; a first metal cladding layer on a first side of the insulating core material, wherein the interconnect structure is directly bonded to the first metal cladding layer; a second metal cladding layer on a second side of the insulating core material opposite the first side of the insulating core material; and a second through via extending through the insulating core material, wherein the second through via electrically connects the first metal cladding layer to the second metal cladding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
an interposer structure free of any transistors, the interposer structure comprises:
an interconnect device;
a dielectric film surrounding the interconnect device;

first metallization pattern bonded to the interconnect device;
a second interconnect structure on an opposing side of the dielectric film as the first metallization pattern; and
a through via extending through the dielectric film, wherein the through via electrically connects the second interconnect structure to the first metallization pattern;
a first device die bonded to an opposing side of the first metallization pattern as the interconnect device;
a second device die bonded to a same side of the first metallization pattern as the first device die, wherein the interconnect device electrically connects the first device die to the second device die, wherein the interconnect device overlaps both the first device die and the second device die, and wherein the first metallization pattern comprises:
a first conductor extending continuously from a first connector of the first device die to a second connector of the interconnect device; and
a second conductor extending continuously from a third connector of the second device die to a fourth connector of the interconnect device; and
a core substrate bonded to an opposing side of the second interconnect structure as the dielectric film.

2. The package of claim 1, wherein the interposer structure further comprises a passive device bonded to a same side of the first metallization pattern as the interconnect device, wherein the passive device is electrically connected to the first device die or the second device die.

3. The package of claim 1, wherein the interconnect device is flip chip bonded to the first metallization pattern.

4. The package of claim 1, wherein the interconnect device comprises:
a semiconductor substrate; and
a first interconnect structure on the semiconductor substrate, wherein the first interconnect structure comprises electrical routing that electrically routes signals between the first device die and the second device die.

5. The package of claim 4, wherein a pitch of the electrical routing is in a range of 0.1 µm to 5 µm.

6. The package of claim 1, wherein the first device die and the second device die are each directly bonded to the first metallization pattern.

7. The package of claim 1, wherein the core substrate comprises:
an insulating core material;
a first metal cladding layer on a first side of the insulating core material, wherein the second interconnect structure is directly bonded to the first metal cladding layer;
a second metal cladding layer on a second side of the insulating core material opposite the first side of the insulating core material; and
a second through via extending through the insulating core material, wherein the second through via electrically connects the first metal cladding layer to the second metal cladding layer.

8. A package comprising:
an interposer free of transistors, the interposer comprising:
an interconnect device comprising:
a semiconductor substrate; and
a first interconnect structure on the semiconductor substrate;
a passive device;
a dielectric film burying the interconnect device and the passive device;
a first metallization pattern over the dielectric film, the interconnect device, and the passive device, wherein the interconnect device is bonded to a first surface of the first metallization pattern by first solder regions, and the passive device is bonded to the first surface of the first metallization pattern by second solder regions; and
a first underfill around the first solder regions, wherein the dielectric film surrounds and contacts the first underfill;
a first device die directly bonded to a second surface of the first metallization pattern by third solder regions, wherein the first surface of the first metallization pattern is opposite to the second surface of the first metallization pattern;
a second device die directly bonded to the second surface of the first metallization pattern by fourth solder regions, wherein electrical routing in the first interconnect structure electrically routes signals between the first device die and the second device die; and
a core substrate directly bonded to an opposing side of the interposer as the first device die and the second device die, wherein the core substrate comprises:
an insulating core material;
a first metal cladding layer on a first side of the insulating core material; and
a second metal cladding layer on a second side of the insulating core material opposite the first side of the insulating core material.

9. The package of claim 8, wherein the passive device is electrically connected to the first device die or the second device die.

10. The package of claim 8, wherein the interposer further comprises:
a second interconnect structure on an opposing side of the dielectric film as the first metallization pattern;
a first through via extending through the dielectric film, wherein the first through via electrically connects the second interconnect structure to the first metallization pattern; and
fifth solder regions on an opposing side of the second interconnect structure as the first through via.

11. The package of claim 8, wherein the core substrate further comprises:
a second through via extending through the insulating core material, wherein the second through via electrically connects the first metal cladding layer to the second metal cladding layer.

12. The package of claim 11 further comprising:
a third underfill around the third solder regions; and
a fourth underfill around the fourth solder regions.

13. The package of claim 8, wherein fifth solder regions of the interposer are directly bonded to the first metal cladding layer.

14. The package of claim 8, further comprising sixth solder regions directly contacting the second metal cladding layer.

15. The package of claim 8, wherein the interposer further comprises:
a second underfill around the second solder regions, wherein the dielectric film surrounds and contacts the second underfill.

16. The package of claim 15, wherein the first underfill is physically separated from the second underfill.

17. A semiconductor device comprising:
- an interconnect device bonded to a first surface of a first metallization structure, wherein the interconnect device is free of any transistors;
- a passive device bonded to the first surface of the first metallization structure, wherein the passive device is free of any transistors;
- a dielectric film around the interconnect device and the passive device;
- a first device die bonded to a second surface of the first metallization structure, wherein the second surface of the first metallization structure is opposite to the first surface of the first metallization structure;
- a second device die bonded to the second surface of the first metallization structure, wherein the interconnect device is electrically connected to both the first device die and the second device die such that the interconnect device electrically routes signals between the first device die and the second device die; and
- a core substrate bonded to an opposing side of the second metallization structure as the dielectric film, wherein the core substrate comprises:
  - an insulating core material;
  - a first metal cladding layer on a first side of the insulating core material, wherein the second metallization structure is directly bonded to the first metal cladding layer;
  - a second metal cladding layer on a second side of the insulating core material opposite the first side of the insulating core material; and
  - a second through via extending through the insulating core material, wherein the second through via electrically connects the first metal cladding layer to the second metal cladding layer.

18. The semiconductor device according to claim 17, further comprising:
- a through via on the first metallization structure, wherein the through via extends through the dielectric film; and
- a second metallization structure on a surface the dielectric film opposite to the first metallization structure, wherein the through via electrically connects the first metallization structure to the second metallization structure.

* * * * *